Sept. 21, 1965

R. HOPT ET AL 3,206,988

PUSH BUTTON TUNING DEVICE

Filed March 24, 1964

INVENTORS
Rudolf Hopt
Rudolf Mayer

BY Dicke & Craig

ATTORNEYS

United States Patent Office 3,206,988

Patented Sept. 21, 1965

3,206,988

PUSH BUTTON TUNING DEVICE

Rudolf Hopt, Schorzingen, and Rudolf Mayer, Rottweil (Neckar), Germany, assignors to R. & E. Hopt K.G., Rottweil (Neckar), Germany, a firm Filed Mar. 24, 1964, Ser. No. 354,370

Claims priority, application Germany, Mar. 26, 1963, H 48,644

13 Claims. (Cl. 74—10.27)

Figures 1, 2:
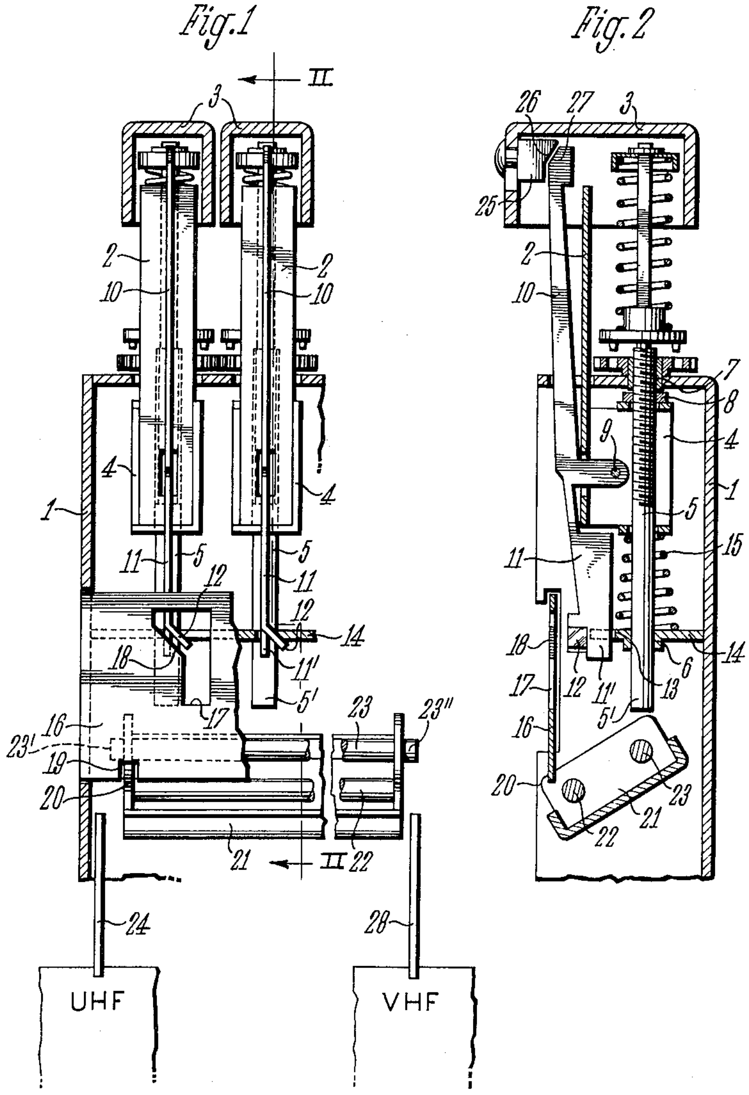

This invention relates to push button tuning devices for radio and television receivers and is particularly concerned with a device for providing selective actuation of several tuning elements by a plurality of push buttons wherein each push button carries a pivotally mounted lever the position of which determines which of the tuning elements is actuated by the push button unit.

In a known device of this kind the lever engages a slider in its operative position, which actuates an electric switch, in such a manner that when the slider is displaced one tuning unit is electrically switched on and the other tuning unit is electrically switched off. In the rest position of the lever, that is when the slider is not displaced by the push button, the other tuning unit is electrically switched on and the first mentioned tuning unit is electrically switched off.

This known device has the disadvantage that the tuning elements of both tuning units are always actuated mechanically and irrespective of whether one tuning unit or the other tuning unit is to be switched on by the push button selected for use. In general a spring in each tuning unit opposes the movement of the elements displaced during tuning, so that the pressure necessary for actuating the push button is quite high in this known device. Moreover, this known device has the disadvantage that the levers which can be displaced into a slider-engaging position or into a rest position are disposed completely within the housing of the radio or television apparatus and thus are not accessible from outside.

The invention avoids this disadvantage and provides that the outer end of the lever is extended to the outside of the apparatus and is displaceable from the outside and that the inner end of the lever forms a stop and co-operates in one position thereof when the push button is depressed and the lever is in a first pivotal position with a cam which is connected in a force transmitting manner to a member inserted into the actuating path between the push button and the tuning units. This member is movable transversely to the movement caused by the push button and, depending upon its position, cooperates with the driving element of one tuning unit or with the driving element of the other tuning unit.

The particular advantage of the invention is that in this manner the individual push buttons can be selected for particular tuning units from outside of the device. Therefore, the user of the apparatus can choose at any time whether he wishes to utilise any of the push buttons for tuning to a transmitter for instance in the U.H.F. range, or, alternatively, to a transmitter in the V.H.F. range. In the known devices this choice had to be made already by a dealer who is in a position to make adjustments inside the housing of the device.

A further advantage of the invention is that when the push button is depressed always only a single tuning unit is adjusted mechanically, that is the tuning elements of only a single tuning unit are moved. Owing to this the pressure necessary for actuating the push button is considerably less than in the known tuning devices.

In one embodiment of the invention the outer end of the lever is extended into the region of the push button head and the outer lever end is accessible or operable in this region.

In various embodiments of the invention the outer lever end may be arranged to extend laterally of, above or below the push button. In one embodiment of the invention the outer end of the lever extends directly into the push button knob or head. This end may extend further through a recess in the knob and thus be adapted to be gripped or, alternatively, a finger grip may be movably guided in the knob or head and engage the outer end of the lever. For instance a slider may be guided in the push rod knob so as to engage the outer lever end.

In one embodiment of the invention cams which are engaged by individual stops of push rods of the push buttons are arranged on a transversely movable slider and the latter is non-displaceably connected to a transversely movable member, preferably a rocker, for instance so that the slider and the rocker are connected to each other by means of projections or members adapted to engage recesses.

Further features of the invention are apparent from the following description of one embodiment of the invention in conjunction with the claims and the accompanying drawings. The individual features may be incorporated singly or several in combination in one embodiment of the invention.

One embodiment of the invention is illustrated in the accompanying drawings, in which:

FIG. 1 is a top view of the device showing the parts necessary for understanding the invention, partly in section, and FIG. 2 is a section along the line II—II of FIG. 1.

In the accompanying drawings there is shown the essential parts of the push button assembly for a radio or television receiver, but it has not been judged necessary to illustrate in detail the tuning elements operated selectively by the push button assembly as such elements from no part of the invention and are constructed in accordance with normal practice in this art.

In the embodiment of the invention illustrated in the drawings a push rod 2 is displaceably mounted in a casing 1 of the device and a push button head 3 is attached to the outer end of the push rod. A fine tuning spindle 5 is rotatably mounted in a member 4 attached to the rod 2, and is displaceably mounted in a bearing 6 in the vicinity of the one end thereof and in a bearing bush 7 in the housing 1. A threaded nut 8, the internal screw thread of which is engaged by an outer screw thread on the spindle 5, is attached to the member 4 of the rod 2. When the fine adjustament spindle is rotated the length of the spindle portion projecting beyond the member 4 into the interior of the apparatus is changed.

A lever 10, 11 is pivotally mounted on a bearing pin 9 supported by the rod 2. The inner end 11' of the lever has a stop 12 having an oblique face. The inner end 11' of the lever is displaceably guided in a recess 13 of a partition wall 14 in the housing 1. A tapered spring 15 which presses the push rod outwardly is provided between the portition wall 14 and the member 4 of the rod 2.

In the housing 1 a slider 16 is guided so as to be displaceable transversely to the push rod movement and has a recess 17 in the region of the inner end 11′, 12 of the lever 10, 11. When the lever 10 is tilted so that the stop 12 enters the recess 17 of the slider 16, the face of the stop 12 rests against an oblique edge 18 of the recess 17. If the push rod is then pressed inwardly the slide 16 is displaced towards the left in FIG. 1. A member 21 operable by the ends of the push rods carries a projection 20 which engages a cut-out 19 in the slider 16. The member 21 which is pivoted about spindle 22 may be a rocker and is traversed by a push bar 23 engageable by the ends 5′ of the individual fine tuning spindles. If the slider 16 is shifted to the left in FIG. 1 the end 23′ of the push bar 23 abuts a driving element 24 of one of the two tuning units when the rocker 21 is rotated, and moves this driving member 24 as far as is determined by the possible movement, of the push rod and the effective length to which the fine tuning spindle of this push rod had been adjusted.

In order to displace the lever 10, 11 into its effective position a knob 25 is displaceably guided in the push button head 3 and has an oblique face 26 which cooperates with a corresponding oblique face 27 at the outer end of the lever 10. If the knob 25 is shifted the lever is pivoted so that the lever end 11′, 12 enters the recess 17. Furthermore, a spring (not illustrated) which holds the lever in the rest position, engages the knob 25 or the lever 10, 11. The knob 25 may be connected to a detent which holds it in its depressed position and thus holds the lever in the operative position. Alternatively, in place of the knob 25 being operable by depression it may be displaceable in the axial direction of the lever 10, 11 as illustrated to guide the lever into the operative position or into the rest position by means of suitable oblique faces as shown.

If the lever remains in the rest position the stop 12 does not enter the recess 17. When the push button 3 is depressed the stop 12, therefore, does not engage the edge 18 and, therefore, does not displace the slider 16. Consequently, the rocker 21 is not displaced transversely to the axial direction of the push rod so that when the rocker 21 is pivoted the end 23′ of the push bar 23 is moved past the actuating member 24 of the one tuning unit. An end part 23″ projecting from the other side of the rocker 21 contacts in this position an actuating element 28 of the other tuning unit.

What we claim is:

1. In a tuning device containing push buttons for the selective actuation of two alternately operable tuning units, a push button unit comprising push rod means, displaceable means having two positions and operable to be displaced by said push rod means for selectively actuating one or the other of said two tuning units depending on the position thereof, and selector means operatively connected with said displaceable means for shifting said displaceable means from one to the other of said two positions in a substantially transverse direction to the actuation thereof by said push rod means upon actuation of said selector means.

2. In a tuning device containing push buttons for the selective actuation of two alternately operable tuning units, a push button unit comprising push rod means, actuator means displaceable in one direction between two positions and operable by said push rod means in a second direction substantially transverse to said first direction for selectively actuating one or the other of said two tuning units depending on the displacement to the one or the other of said two positions, and selector means operatively connected with said actuator means for shifting said actuator means from one to the other of said two positions in said first direction upon actuation of said push rod means.

3. In a tuning device containing push buttons for the selective actuation of two alternately operable tuning units, a push button unit comprising push rod means, actuator means displaceable in one direction between two positions and operable by said push rod means in a second direction substantially transverse to said first direction for selectively actuating one or the other of said two tuning units depending on the displacement to the one or the other of said two positions, and selector means operatively connected with said actuator means for shifting said actuator means from one to the other of said two positions in said first direction upon actuation of said push rod means including lever means, a movable member operatively connected with said actuator means for displacing said actuator means in said first direction and mutual engaging means operatively connecting said lever means with said movable member to convert pivoting movement of said lever means into movement of said member in said first direction.

4. In a tuning device containing push buttons for the selective actuation of two alternately operable tuning units, a push button unit comprising push rod means, fine tuning means for regulating the effective length of said push rod means, actuator means displaceable in one direction between two positions and operable by said push rod means in a second direction substantially transverse to said first direction for selectively actuating one or the other of said two tuning units depending on the displacement to the one or the other of said two positions, and selector means operatively connected with said actuator means for shifting said actuator means from one to the other of said two positions in said first direction upon actuation of said push rod means including lever means pivotally carried by said push rod means, a movable member operatively connected with said actuator means for displacing said actuator means in said first direction and mutual engaging means operatively connecting said lever means with said movable member to convert pivoting movement of said lever means into movement of said member in said first direction.

5. In a tuning device containing push buttons for the selective actuation of two alternately operable tuning units, a push button unit comprising push rod means, actuating means operated by the push rod means of said device and operable during movement in one direction for selectively engaging one or the other of said two tuning units, means displaceable in unison with the respective push rod means and operable in one condition thereof to displace said actuating means substantially transversely to said one direction from a first position to a second position upon actuation of said push rod means, and selector means carried by said unit to select the operating condition of said displaceable means for the selective operation of one or the other of said tuning elements.

6. The combination according to claim 5, wherein said means displaceable with the push rod means is a pivoted lever.

7. The combination according to claim 6, wherein said push rod means includes a head portion, and wherein the outer end of said lever extends into the region of the head portion of said push rod means, and the outer end of said lever is operable to be shifted by the selector means located within said region.

8. The combination according to claim 7, wherein said selector means includes a finger-operated knob engaging the outer end of said lever which is movably mounted in the head portion of said push rod means.

9. The combination according to claim 7, wherein said selector means includes a slide member guided in the head portion of said push rod means which engages with the outer end of said lever.

10. The combination according to claim 7, wherein said selector means includes a push button guided within the head portion of said push rod means to engage the outer end of said lever.

11. The combination according to claim 6, wherein said displaceable means includes an oblique face portion engageable by a projection on said lever, said oblique face portion being provided on a transversely movable slide member forming part of said displaceable means and operable to engage said actuating means.

12. The combination according to claim 5, wherein said actuating means is a pivoted rocker.

13. In a tuning device containing push buttons for the selective actuation of two alternately operable tuning units, a push button unit comprising push rod means, fine tuning means for regulating the effective length of said push rod means, actuating means including axially movable rocker means operated by all of the push rod means of said device and operable during rocking movement in one direction for selectively engaging one or the other of said two tuning units, means displaceable in unison with the respective push rod means and operable in one condition thereof to displace said actuating means substantially transversely to said one direction in the axial direction thereof from a first position to a second position upon actuation of said push rod means, said displaceable means including lever means pivotally carried by said push rod means, a member adapted to move in said substantially transverse direction and force-lockingly connected with said actuator means and mutual engaging means on said lever means and said member for displacing said member in said substantial transverse direction, and selector means actuatable externally of said push button unit and carried by said unit to select the operating condition of said displaceable means for the selective operation of one or the other of said tuning elements to an extent determined by the fine tuning means.

References Cited by the Examiner

UNITED STATES PATENTS 2,344,091 3/44 Kirk -------------- 74—10.33 X

BROUGHTON G. DURHAM, *Primary Examiner.*

MILTON KAUFMAN, *Examiner.*